US008546159B2

(12) United States Patent
Yoo et al.

(10) Patent No.: US 8,546,159 B2
(45) Date of Patent: Oct. 1, 2013

(54) PHOSPHOR FILM, METHOD OF FORMING THE SAME, AND METHOD OF COATING PHOSPHOR LAYER ON LED CHIPS

(75) Inventors: Cheol-jun Yoo, Chungcheongnam-Do (KR); Seong-jae Hong, Gyeonggi-Do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/217,828

(22) Filed: Aug. 25, 2011

(65) Prior Publication Data

US 2012/0052608 A1    Mar. 1, 2012

(30) Foreign Application Priority Data

Aug. 25, 2010  (KR) .................. 10-2010-0082640

(51) Int. Cl.
*H01L 21/00* (2006.01)
*B05B 5/00* (2006.01)
(52) U.S. Cl.
USPC ................................ 438/27; 438/29; 427/157
(58) Field of Classification Search
USPC .............. 438/27, 29; 427/157; 257/E33.061
See application file for complete search history.

(56) References Cited

U.S. PATENT DOCUMENTS

| 5,019,748 | A  | * | 5/1991 | Appelberg ................. 315/169.3 |
| 5,858,616 | A  | * | 1/1999 | Tanaka et al. .............. 430/281.1 |
| 2001/0046553 | A1 | * | 11/2001 | Umemoto et al. .............. 427/68 |
| 2004/0166443 | A1 | * | 8/2004 | Tai et al. .................... 430/286.1 |
| 2006/0033031 | A1 | * | 2/2006 | Takeda et al. ............ 250/370.11 |
| 2008/0054279 | A1 | * | 3/2008 | Hussell et al. .................. 257/95 |
| 2009/0134414 | A1 |   | 5/2009 | Li et al. |
| 2010/0181582 | A1 | * | 7/2010 | Li et al. .......................... 257/91 |
| 2010/0295079 | A1 | * | 11/2010 | Melman ......................... 257/98 |
| 2011/0025183 | A1 | * | 2/2011 | Su et al. .......................... 313/1 |

FOREIGN PATENT DOCUMENTS

| KR | 10-2002-0029611 A | 4/2002 |
| KR | 10-2006-0071958 A | 6/2006 |
| KR | 10-2006-0109221 A | 10/2006 |
| KR | 10-2009-0115535 A | 11/2009 |

* cited by examiner

*Primary Examiner* — Kevin Parendo
(74) *Attorney, Agent, or Firm* — McDermott Will & Emery LLP

(57) ABSTRACT

Phosphor films, methods of forming the phosphor films, and methods of coating a phosphor layer on light-emitting chips are disclosed. The phosphor film includes: a base film; a phosphor layer that is formed on the base film and comprises an incompletely cured resin material and phosphor particles mixed with the incompletely cured resin material; and a cover film that is formed on the phosphor layer and protects the phosphor layer.

25 Claims, 16 Drawing Sheets

PHOSPHOR FILM, METHOD OF FORMING THE SAME, AND METHOD OF COATING PHOSPHOR LAYER ON LED CHIPS

CROSS-REFERENCE TO RELATED APPLICATIONS

This application claims the benefit of Korean Patent Application No. 10-2010-0082640, filed on Aug. 25, 2010, in the Korean Intellectual Property Office, the disclosure of which is incorporated herein in its entirety by reference.

BACKGROUND

1. Field

The present disclosure relates to a phosphor film, a method of forming the same, and a method of coating a phosphor layer on light-emitting chips.

2. Description of the Related Art

Light emitting diodes (LEDs) are semiconductor devices that produce light of various colors from a light emitting source formed at a PN junction of a compound semiconductor. Recently, blue LEDs and ultraviolet (UV) LEDs have been developed by using nitrides with excellent physical and chemical properties, and also, white light or light of other mono-color has been generated by using blue or UV LEDs and a phosphor material, thereby widening the application range of LEDs.

Conventionally, a LED chip includes a lower portion, an upper portion, and front, rear, left, and right side portions. The lower portion is formed of a reflective layer, and light is emitted through the upper portion and front, rear, left, and right side portions. In this structure, when color of an emitted light is changed by using a phosphor, it is very important to maintain a coating thickness of the phosphor on the top portion and four side surfaces of the LED chip to a constant level so as to obtain uniform light quality. In response to such a need, various conformal coating techniques have been introduced. However, most of the conformal coating techniques are performed before wire bonding and are applicable only to flipchip-type packages. Also, an additional process is required to open a separate wire bonding pad unit while coating a phosphor. In addition, when the phosphor coating is performed on a separate chip in a pre-mold lead frame-type packaging process, the methods may not be used.

An example of a packaging method in which a phosphor is coated after wire bonding is a dispensing process in which phosphor particles are dispersed in a light-transmissible resin with a high resistance to heat so as to form a paste and then a small amount of the paste is ejected through a nozzle having a given diameter to completely cover a chip with the phosphor. Regarding the dispensing process, it is important to appropriately adjust the viscosity of phosphor particles and the resin in order to eject an appropriate amount of small droplets. In this case, however, due to such a low viscosity to proceed with the process, solid inorganic phosphor particles may precipitate in a tube for storing materials, and also, they may precipitate even after the dispensing and before the phosphor paste is cured, and thus, dispersion of phosphor particles in the resin may be lowered. Correspondingly, a light quality distribution range may be widened.

SUMMARY

Provided are phosphor films suitable for forming a phosphor layer having a uniform thickness, methods of forming the phosphor films, and methods of coating a phosphor layer on light-emitting chips by using the phosphor films.

Additional aspects will be set forth in part in the description which follows and, in part, will be apparent from the description, or may be learned by practice of the presented embodiments.

According to an aspect of the present invention, a phosphor film including: a base film; a phosphor layer that is formed on the base film and includes an incompletely cured resin material and phosphor particles mixed with the incompletely cured resin material; a cover film that is formed on the phosphor layer and protects the phosphor layer.

The phosphor film of claim 1, wherein the phosphor layer is in an incompletely cured phase at room temperature and when heated, the phase of the phosphor layer is changed to have a liquidity.

A modulus of the phosphor layer at a temperature of about 0 to about 25° C. is 100 Mpa or more and 500 Mpa or less, and a modulus of the phosphor layer at a temperature of about 60° C. to about 80° C. is in a range of about 0.5 Mpa to about 3 Mpa.

The base film may include an expandable polymer material, for example, polyolefin.

The phosphor film may further include a temporary adhesive layer interposed between the phosphor layer and the cover film.

The phosphor layer may include a plurality of phosphor pieces spaced apart from each other at given intervals, and the cover film may include a plurality of cover film pieces with sizes corresponding to the phosphor pieces.

The phosphor layer may include a light-transmissible spacer with a predetermined thickness, and a surface of the spacer is coated with a reflective layer.

According to another aspect of the present invention, a method of forming a phosphor film includes: preparing a base film; and forming a phosphor layer on the base film, wherein the phosphor layer includes an incompletely cured resin material and phosphor particles mixed with the incompletely cured resin material, and also includes a plurality of phosphor pieces spaced apart from each other.

The forming of the phosphor layer may include: forming a thin layer on the base film, wherein the thin layer includes the incompletely cured resin material and the phosphor particles mixed with the incompletely cured resin material; forming a cover film on the thin layer; forming cutting lines along which the thin layer and the cover film are to be cut into pieces with given sizes; and expanding the base film so that the thin layer and the cover film are spaced apart from each other along the cutting lines.

The forming of the cutting lines may include: forming a plurality of first cutting lines parallel to each other in one direction in the thin layer and the cover film; and cutting the thin layer, the cover film, and the base film in a strip form along a second cutting line perpendicular to the first cutting lines.

The forming of the phosphor layer includes: forming a thin layer on the base film, wherein the thin layer includes the incompletely cured resin material and the phosphor particles mixed with the incompletely cured resin material; a plurality of first cutting lines parallel to each other in one direction in the thin layer; expanding the base film so that the thin layer is divided into a plurality of regions by the first cutting lines; forming a cover film on the thin layer; and cutting the cover film, the thin layer, and the base film in a strip form along a second cutting line perpendicular to the first cutting lines.

The forming of the phosphor layer may include: positioning a mask having a plurality of holes with sizes corresponding to the phosphor pieces on the base film; printing a mixture including the incompletely cured resin material and the phosphor particles on the base film by using the mask; forming a cover film on the printed structure.

According to another aspect of the present invention, a method of coating a phosphor layer on a plurality of light-emitting diode (LED) chips includes: preparing a phosphor film comprising a phosphor layer that includes an incompletely cured resin material and phosphor particles mixed with the incompletely cured resin material; coating the phosphor layer on the LED chips and surroundings of the LED chips by heating the phosphor layer so as to have a liquidity and pressing the phosphor layer having a liquidity toward the LED chip.

The phosphor film may include: a base film on which the phosphor layer is formed and a cover film for protecting the phosphor layer, wherein the phosphor layer is cut into a plurality of phosphor pieces with sizes corresponding to the LED chips.

The coating of the phosphor layer may include: picking up one phosphor piece and one cover film piece from the base film; positioning the phosphor piece and the cover film in such a way that the phosphor piece faces one of the LED chips; heating the phosphor piece to have a liquidity and pressing the phosphor piece having a liquidity toward the one of the LED chips.

The method may further include irradiating ultraviolet rays to reduce an adhesive force between the phosphor piece and the base film.

The coating of the phosphor layer may include: separating the cover film from the phosphor film; positioning the phosphor film from which the cover film is removed in such a way that one phosphor piece faces one of the LED chips; applying a pressure to a surface of the base film opposite to another surface on which the phosphor pieces are formed, so as to separate the phosphor piece from the base film, and heating the phosphor piece to have a liquidity so that the phosphor piece having a liquidity is attached to the LED chip and a surrounding of the LED chip.

The method may further include irradiating ultraviolet rays to reduce an adhesive force of between the phosphor piece and the base film.

The phosphor pieces are sequentially coated on the LED chips and surroundings of the LED chips by pressing the surface of the base film opposite to the surface on which the phosphor pieces are formed by using a roller, so that one phosphor piece is coated on one LED chip and a surrounding thereof.

The phosphor pieces are simultaneously coated on the LED chips and surroundings of the LED chips by pressing the surface of the base film opposite to the surface on which the phosphor pieces are formed.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
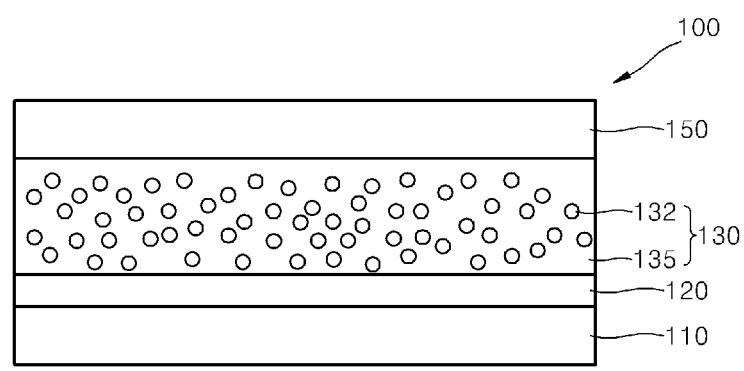
FIG. 1 is a schematic sectional view of a phosphor film according to an embodiment of the present invention.

Reference will now be made in detail to embodiments, examples of which are illustrated in the accompanying drawings, wherein like reference numerals refer to like elements throughout and the sizes or thicknesses of the elements may be enlarged for clarity. In this regard, the present embodiments may have different forms and should not be construed as being limited to the descriptions set forth herein. Accordingly, the embodiments are merely described below, by referring to the figures, to explain aspects of the present description.

FIG. 1 is a schematic sectional view of a phosphor film 100 according to an embodiment of the present invention. Referring to FIG. 1, the phosphor film 100 may include a base film 110, a phosphor layer 130 formed on the base film 110, and a cover film 150 for protecting the phosphor layer 130. Also, a temporary adhesive layer may be further formed between the base film 110 and the phosphor layer 130.

The base film 110 may act as a carrier of the phosphor layer 130. The base film 110 may be formed of a traditional polymer material such as PVC, polyolefin, PET, or PI. For example, the base film 110 may be formed of an expanding material, for example, polyolefin. If it is required that the base film 110 has heat-resistant properties, the base film 110 may be formed of a PI-based polymer.

The temporary adhesive layer 120 may have a property such that before a packaging process is performed, an adhesive force of the temporary adhesive layer 120 is maintained to attach the phosphor layer 130 to the base film 110, and in the packaging process, for example, when the phosphor layer 130 needs to be separated from the base film 110 to coat the phosphor layer 130 on a light-emitting diode (LED) chip, the adhesive force of the temporary adhesive layer 120 is easily reduced. Use of the temporary adhesive layer 120 may be optional. The temporary adhesive layer 120 may be formed of a material that originally has an adhesive property but loses its adhesive property when cured by heat or ultraviolet (UV) rays. The temporary adhesive layer 120 may be formed of, for example, a mixed material including a polymer-based resin and an UV curable polymer, and in this case, the adhesive property of the temporary adhesive layer 120 may be reduced by UV irradiation. An example of a UV curable polymer is an acryl-based resin. A thickness of the temporary adhesive layer 120 may be in a range of several to tens micron.

The phosphor layer 130 may include an incompletely cured resin and phosphor particles mixed with the incompletely cured resin. For example, the phosphor layer 130 may be a B-stage cured complex including phosphor particles 132 and a polymer binder 135 including a resin, a curing agent, and a curing catalyst, in which the phosphor particles 132 are mixed with the polymer binder 135. The phosphor particles 132 may consist of the same kind of phosphor or different kinds of phosphors mixed in a given mixture ratio. A resin for use in the phosphor layer 130 may be a resin that is highly adhesive, highly light-transmissible, and highly resistant to heat and humidity and has a high light refraction rate, and may be an epoxy-based resin or an inorganic polymer such as silicon. An additive for improving an adhesive force of the phosphor layer 130 may be, for example, a silane-based material. The phosphor layer 130 is coated in a liquid phase on the base film 110, dried, and incompletely cured, thereby forming a structure that is solid at room temperature. If the incompletely cured phosphor layer 130 is heated, the phase of the phosphor layer 130 is changed into a flowable phase. This phase change is useful for a LED packaging process, which will be described later, and once the phosphor layer 130 is coated on a desired subject, a curing process is further performed on the phosphor layer 130 to completely cure the phosphor layer 130, thereby forming a completely cured solid-phase structure. To do this, a modulus of the phosphor layer 130 at room temperature may be about 100 MPa or more, and modulus of the phosphor layer 130 at a temperature of about 65° C. or more may be about 20 MPa or less. For example, a modulus of the phosphor layer 130 at a temperature of about 0 to about 25° C. may be in a range of about 100 Mpa to 500 Mpa, and a modulus of the phosphor layer 130 at a temperature of about 60° C. to about 80° C. may be in a range of about 0.5 Mpa to 3 Mpa. An appropriate modulus may differ according to a subject through which the flowable phosphor layer 130 penetrates, for example, a thickness or rigidity of a wire used to wire-bond LED chip. In general, a large modulus change according to temperature is suitable for this process. This kind of property may lead to good cutting properties when the phosphor layer 130 needs to be cut in advance in forming the phosphor film 100. Also, a wire may not be deformed at high temperature under which packaging is performed, for example, when a wire bonded LED chip is pressed downwards by the phosphor layer 130. In order to achieve such a property, a resin for use in the phosphor layer 130 may consist of a thermosetting resin, or a mixture including a silicone resin and a thermoplastic resin.

The phosphor layer 130 may further include a spacer (not shown). The spacer may allow the phosphor layer 130 to be formed to an appropriate thickness when the phosphor layer 130 is coated on a subject, and may have the same thickness as the phosphor layer 130. In the phosphor layer 130, the spacer may be in an amount of several % or less. In order to prevent a decrease in photo characteristics, the spacer may be formed of an inorganic or organic material that has high light transmissibility. Alternatively, in order to reflect light at a surface of the spacer, the spacer may be formed of an inorganic or organic material that has a surface coated with a reflective layer with high light reflectivity.

Like the base film 110, the cover film 150 may be formed of a traditional polymer material such as PVC, polyolefin, PET, or PI. A surface of the cover film 150 contacting the phosphor layer 130 may be coated with a releasing agent enabling the cover film 150 to be easily separated from the phosphor layer 130.

Figure 2:
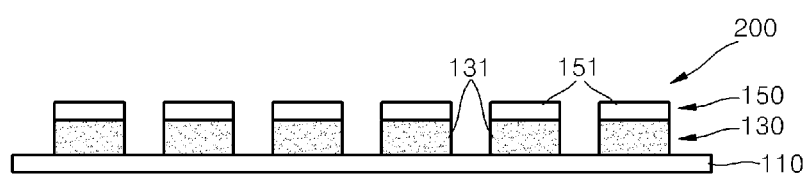
FIG. 2 is a schematic sectional view of a phosphor film according to another embodiment of the present invention.

FIG. 2 is a schematic sectional view of a phosphor film 200 according to another embodiment of the present invention. The phosphor film 200 according to the present embodiment includes a phosphor layer 130 cut into predetermined sizes in advance. That is, the phosphor layer 130 may include a plurality of phosphor pieces 131 with given sizes spaced apart from each other at given intervals. In addition, the cover film 150 may include a plurality of cover film pieces 151 having sizes corresponding to the phosphor pieces 131. The sizes or intervals of the phosphor pieces 131 may be appropriately determined according to a subject on which the phosphor pieces 131 are to be coated, and for example, when the phosphor pieces 131 are to be coated on a plurality of LED chips aligned on a substrate, the sizes or intervals of the phosphor pieces 131 may be determined according to sizes of the LED chips and intervals at which the LED chips are spaced apart from each other. The phosphor pieces 131 may be aligned one-dimensionally in one direction, or two-dimensionally.

Figure 3:
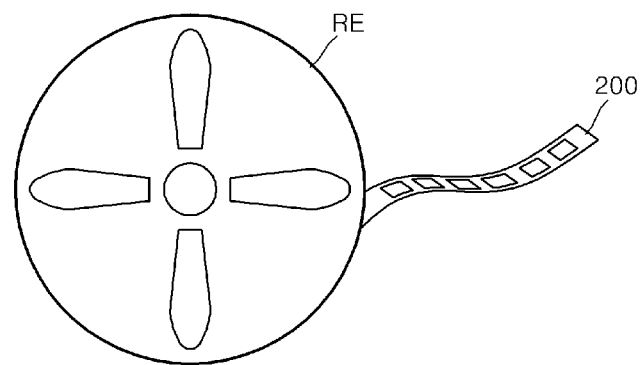
FIG. 3 is a view for explaining storing the phosphor film of FIG. 2.

FIG. 3 is a view for explaining storing the phosphor film 200 of FIG. 2. The phosphor film 200 has a strip form that is suitable for reel-type storage. This kind of storage is possible at room temperature at which the phosphor layer 130 is in an incompletely cured phase, and when used, a required number of phosphor pieces 131 are coated on a target material by heating. FIG. 3 illustrates one-dimensional alignment of the phosphor pieces 131 of the phosphor film 200. However, the phosphor pieces 131 of the phosphor film 200 are just an example and the structure of the phosphor pieces 131 is not limited thereto.

Figure 4:
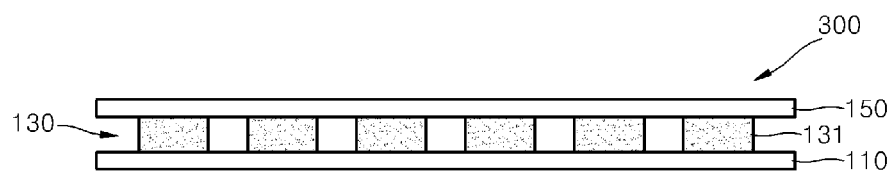
FIG. 4 is a schematic sectional view of a phosphor film according to another embodiment of the present invention.

FIG. 4 is a schematic sectional view of a phosphor film 300 according to another embodiment of the present invention. The phosphor film 300 according to the present embodiment includes a phosphor layer 130 that consists of a plurality of phosphor pieces 131 of predetermined sizes, which are spaced apart from each other at predetermined intervals. However, the phosphor film 300 according to the present embodiment is different from the phosphor film 200 of FIG. 2 in that the cover film 150 is a layer covering the phosphor pieces 131 at once. The phosphor pieces 131 may be aligned one-dimensionally or two-dimensionally. As illustrated in FIG. 3, the phosphor film 300 may also be suitable for reel-type storage, and when used, the cover film 150 may be separated from the phosphor film 300.

Figure 5:
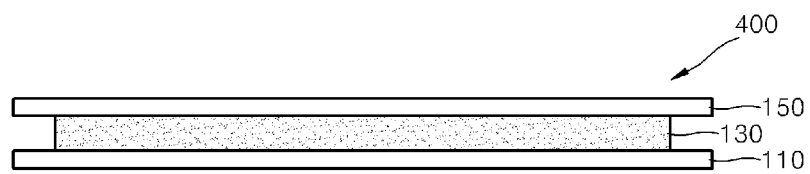
FIG. 5 is a schematic sectional view of a phosphor film according to another embodiment of the present invention.

FIG. 5 is a schematic sectional view of a phosphor film according to another embodiment of the present invention. In the present embodiment, each of a base film 110, a phosphor layer 130, and a cover film 150 is composed as a single film. The phosphor film 400 may have a strip form that is suitable for reel-type storage as illustrated in FIG. 3. When used, the cover film 150 is separated from the phosphor film 400.

The phosphor layers 130 of FIGS. 2, 4, and 5 may have the same properties as the phosphor layer described with reference to FIG. 1. In addition, although not illustrated, a temporary adhesive layer may be further formed between the phosphor layer 130 and the base film 110. However, use of the temporary adhesive layer is optional. The process for forming the temporary adhesive layer may differ according to the structures of the phosphor films 200, 300, and 400.

Hereinafter, a method of forming a phosphor film will be described in detail. As a method of forming a phosphor layer on a base film, the phosphor layer including phosphor particles and an incompletely cured resin material mixed with the phosphor particles, a method of forming a phosphor layer including a plurality of phosphor pieces spaced apart from each other at predetermined intervals will be exemplarily described.

FIGS. 6A through 6E are views for explaining a method of forming a phosphor film 200, according to an embodiment of the present invention.

Figure 6A:
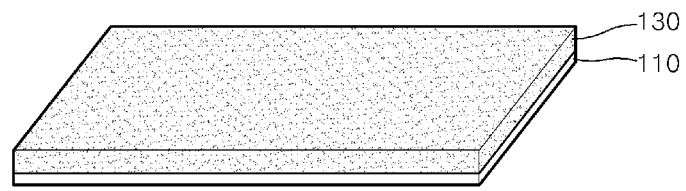
FIGS. 6A through 6E are views for explaining a method of forming a phosphor film, according to an embodiment of the present invention.

Referring to FIG. 6A, first, a phosphor layer 130 is formed on a base film 110. The base film 110 may be formed of an expandable polymer material. The phosphor layer 130 may include an incompletely cured resin material and phosphor particles mixed with the incompletely cured resin material, and may be in an incompletely cured phase at room temperature and when heated, the incompletely cured phase of the phosphor layer 130 may be changed into a flowable phase. The phosphor layer 130 may have substantially the same structure as the phosphor layer 130 described with reference to FIG. 1.

Figure 6B:
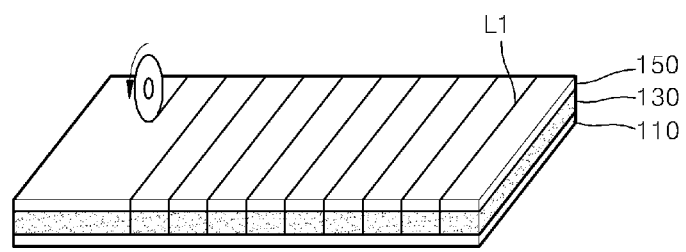

Referring to FIG. 6B, a cover film 150 is formed on the phosphor layer 130. In this regard, before the cover film 150 contacts the phosphor layer 130, a temporary adhesive layer (not shown) may be further formed on a surface of the cover film 150 that is to contact the phosphor layer 130. Then, the cover film 150 and the phosphor layer 130 are cut along, for example, a plurality of first cutting lines L1 parallel to each other.

Figure 6C:
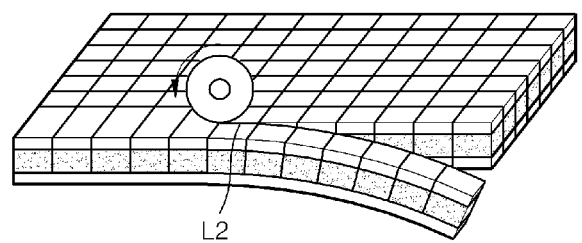

Referring to FIG. 6C, the cover film 150, the phosphor layer 130, and the base film 110 are cut along, for example, second cutting lines L2 perpendicular to the first cutting lines L1.

Figure 6D:
Figure 6E:
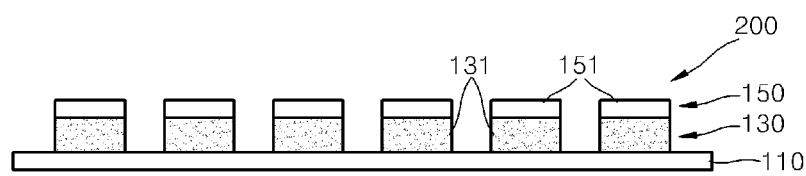

Referring to FIG. 6D, one of the strips formed by cutting is illustrated. Then, the base film 110 is expanded laterally, thereby, as illustrated in FIG. 6E, dividing the phosphor layer 130 into a plurality of phosphor pieces 131 and the cover film 150 into a plurality of cover film pieces 151. The formed phosphor film 200 may be easily stored in a reel type as illustrated in FIG. 3.

FIGS. 7A through 7G are views for explaining a method of forming a phosphor film 300, according to another embodiment of the present invention.

Referring to 7A, a phosphor layer 130 is formed on a base film 110. The base film 110 may be formed of an expandable polymer material. The phosphor layer 130 may include an incompletely cured resin material and phosphor particles mixed with the incompletely cured resin material, and may be in an incompletely cured phase at room temperature and when heated, the incompletely cured phase of the phosphor layer 130 may be changed into a flowable phase. The phosphor layer 130 may have substantially the same structure as the phosphor layer 130 described with reference to FIG. 1.

Figure 7A:
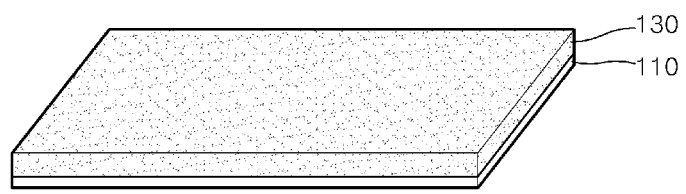
FIGS. 7A through 7G are views for explaining a method of forming a phosphor film, according to another embodiment of the present invention.
Figure 7B:
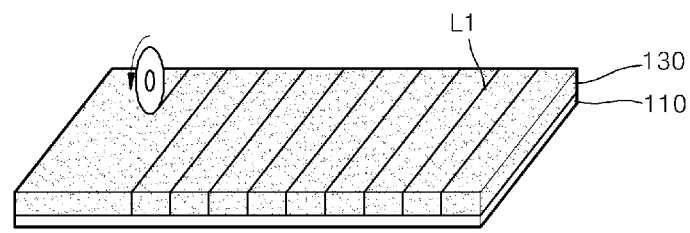
Figure 7C:
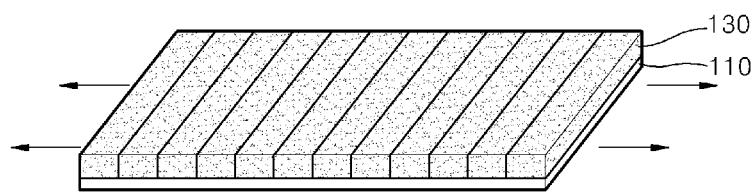
Figure 7D:
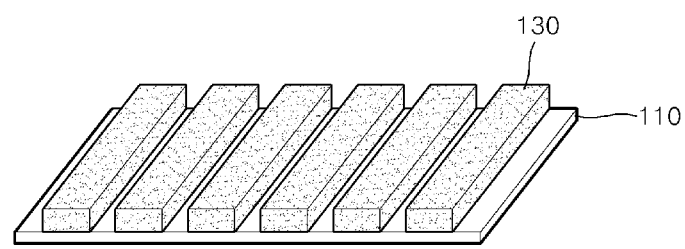
Figure 7E:
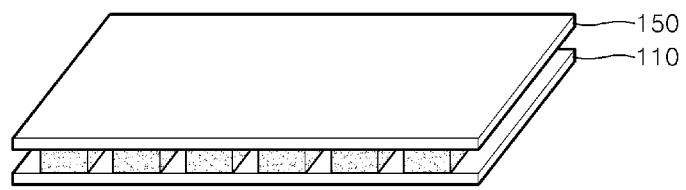
Figure 7F:
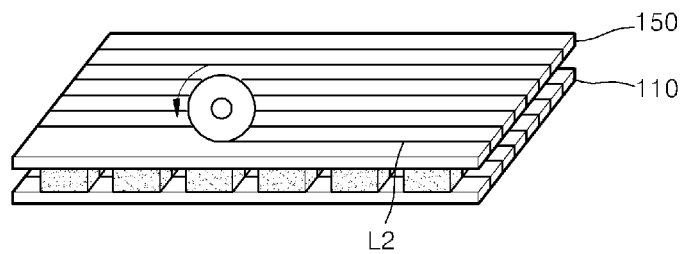

Referring to 7B, the phosphor layer 130 is cut along first cutting lines L1, and as illustrated in FIG. 7C, the base film 110 is expanded laterally, thereby dividing the phosphor layer 130 into a plurality of regions defined by the first cutting lines L1.

Referring to 7E, a cover film 150 is formed on the phosphor layer 130. A temporary adhesive layer (not shown) may be further formed on a surface of the cover film 150 that is to contact the phosphor layer 130.

Figure 7G:
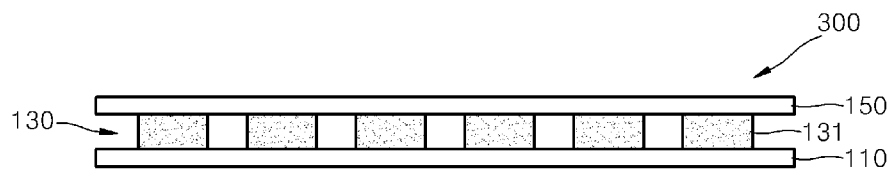

Referring to 7F, the cover film 150, the phosphor layer 130, and the base film 110 are cut along second cutting lines L2 perpendicular to the first cutting lines L1, thereby completing the manufacturing of the phosphor film 300 illustrated in FIG. 7G. The phosphor film 300 may be easily stored in a reel type as illustrated in FIG. 3.

FIGS. 8A through 8E are views for explaining a method of forming a phosphor film, according to another embodiment of the present invention.

Referring to 8A, a mask M having a plurality of holes is disposed on a base film 110. Sizes and intervals of the holes are dependent on sizes and intervals of phosphor pieces to be formed.

Referring to 8B, a paste 130' including an incompletely cured resin material and phosphor particles is printed through the mask M. Thus, as illustrated in FIG. 8C, a phosphor layer 130 including phosphor pieces 131 corresponding to the holes of the mask M is formed.

Figure 8A:
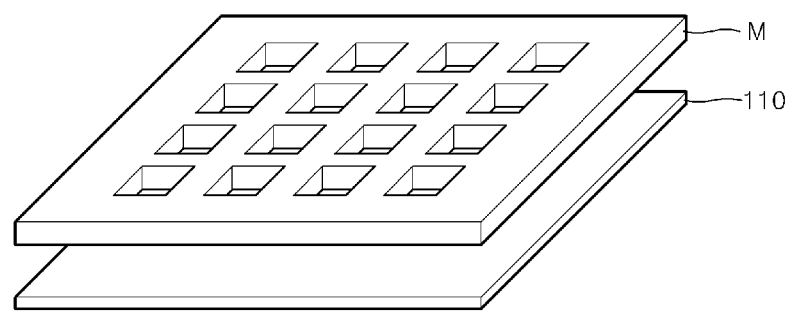
FIGS. 8A through 8E are views for explaining a method of forming a phosphor film, according to another embodiment of the present invention.
Figure 8B:
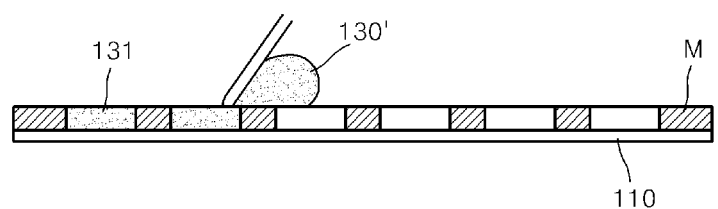
Figure 8C:
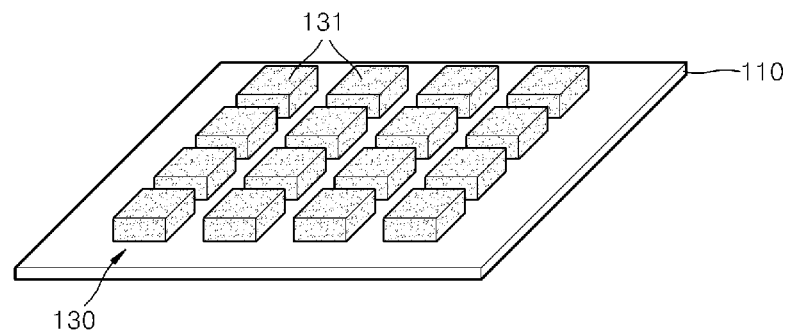
Figure 8D:
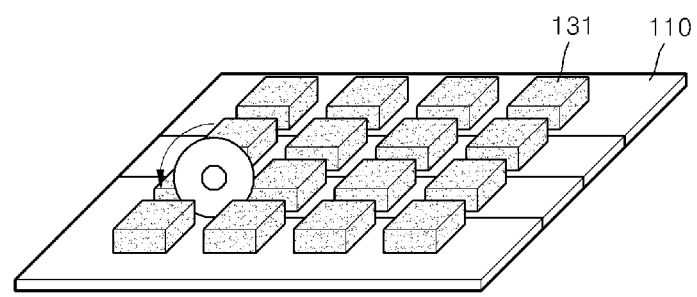
Figure 8E:
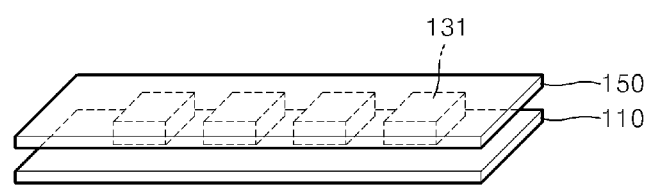

Referring to 8D, the structure of FIG. 8C is cut in a strip form, and as illustrated in FIG. 8E, a cover film 150 is formed on the phosphor layer 130, thereby completing the manufacturing of a phosphor film. The phosphor film may be easily stored in a reel type as illustrated in FIG. 3.

Figure 9A:
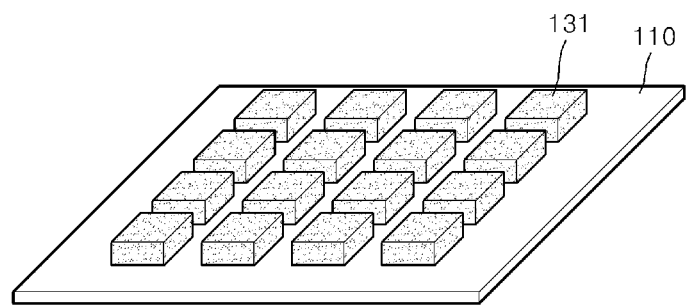
FIGS. 9A and 9B are views for explaining a method of forming a phosphor film, according to another embodiment of the present invention.
Figure 9B:
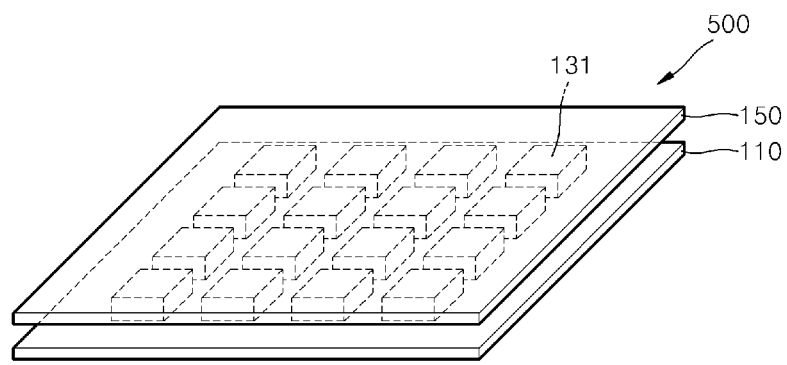

FIGS. 9A and 9B are views for explaining a method of forming a phosphor film 500, according to another embodiment of the present invention. The structure of FIG. 9A is the same as the structure of FIG. 8C, and then as illustrated in FIG. 9B, a cover film 150 is formed on the phosphor layer 130, thereby completing the manufacturing of the phosphor film 500. The phosphor film 500 may be suitable for simultaneously coating the phosphor layer 130 on a plurality of LED chips. The number or locations of the phosphor pieces 131 may be appropriately determined according to locations of the LED chips which are to be coated with the phosphor layer 130.

Hereinafter, a method of coating a phosphor material on a LED chip will be described in detail. In the following embodiments, commonly, a phosphor film including a phosphor layer that includes an incompletely cured resin material and phosphor particles mixed with the incompletely cured resin material is prepared, and then the phosphor layer is heated so that the phosphor layer has liquidity, and the flowable phosphor layer is attached to the LED chip and a surrounding thereof. These processes are exemplarily illustrated below.

FIGS. 10A through 10D are views for explaining a method of coating a phosphor layer on a LED chip, according to an embodiment of the present invention. In the present embodiment, a pickup and press method is used by using the phosphor film 200 of FIG. 6E.

Figure 10A:
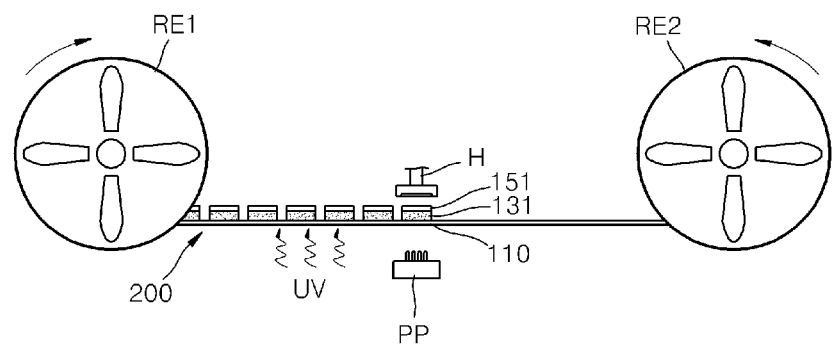
FIGS. 10A through 10D are views for explaining a method of coating a phosphor layer on a light-emitting diode (LED) chip, according to an embodiment of the present invention.

FIG. 10A is a schematic view illustrating a supply reel RE1 for supplying the phosphor film 200, a pickup head H for picking up the phosphor pieces 131 and the cover film pieces 151 from the base film 110, a push pin PP, and a retrieving reel RE2 for retrieving the base film 110. When a temporary adhesive layer (not shown) is formed between the base film 110 and the phosphor pieces 131, UV rays may be irradiated before the pickup in order to weaken an adhesive force.

Figure 10B:
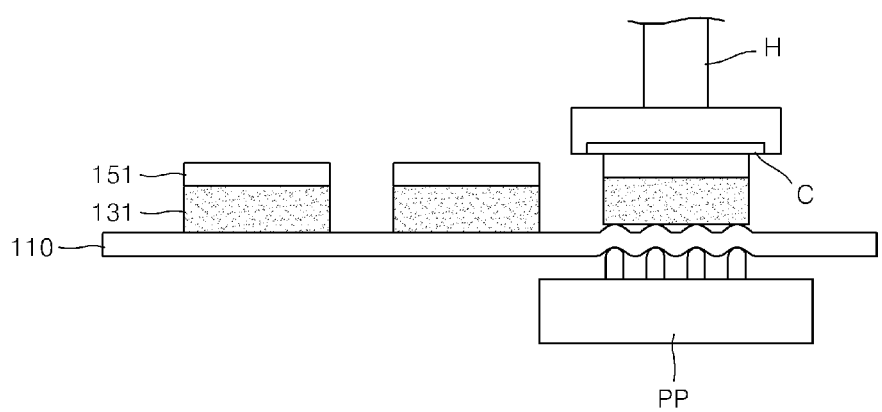

FIG. 10B is a view for explaining a pickup process. The push pin PP and the pickup head H are disposed between the phosphor film 200, and the push pin PP presses the base film 110 upwards. A collet C, which is to contact a subject, is mounted on the pickup head H. A plurality of micro channels (not shown) may be formed on a surface of the collet C, and the pickup head H may temporally catch a subject under reduced pressure through vacuum channels (not shown) formed in the pickup head H. The collet C may be formed of rubber, metal, or a heat-resistant engineering plastic material.

Figure 10C:
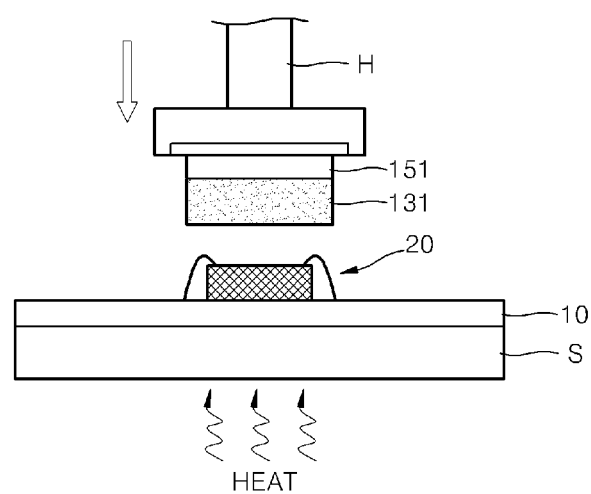
Figure 10D:
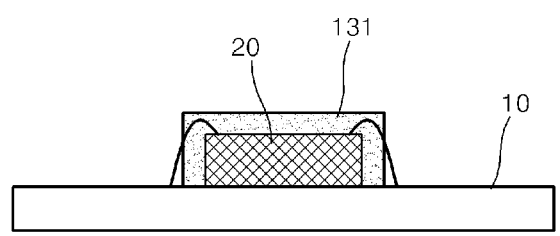

FIG. 10C is a view for explaining a press process in which the pick-upped phosphor piece 131 is attached to the LED chip 20 and a surrounding thereof. In order to heat the phosphor piece 131, a substrate 10 to which the LED chip 20 is wire-bonded is disposed on a heating stage S. When the cover film piece 151 and the phosphor piece 131 approach the LED chip 20, due to the heat, the phosphor piece 131 is changed to have a liquidity and the flowable phosphor piece 131 is attached to the LED chip 20 and a surrounding thereof by penetrating a wire.

Figure 11A:
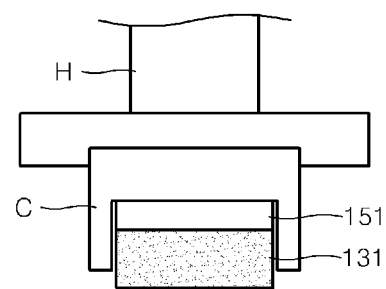
FIGS. 11A and 11B illustrate an example of a pickup head used in a method described with reference to FIGS. 10A through 10D.
Figure 11B:
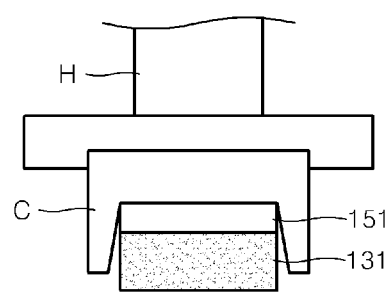

FIGS. 11A and 11B illustrate an example of the collet C mounted on the pickup head H used in the method described with reference to FIGS. 10A through 10D. The collet C illustrated in FIG. 10A is a flat-type collet, and collets C illustrated in FIGS. 11A and 11B are cavity-type collets having a cavity. The cavity may act as a frame enabling a certain structure to retain its structure when the cover film piece 151 and the phosphor piece 131 are picked up. A length of the cavity may be greater than a thickness of the cover film piece 151 and may be smaller than the sum of thicknesses of the cover film piece 151 and the phosphor pieces 131. An incline of an inner side of the cavity may have a right angle as illustrated in FIG. 11A or an obtuse angle as illustrated in FIG. 11B.

Figure 12:
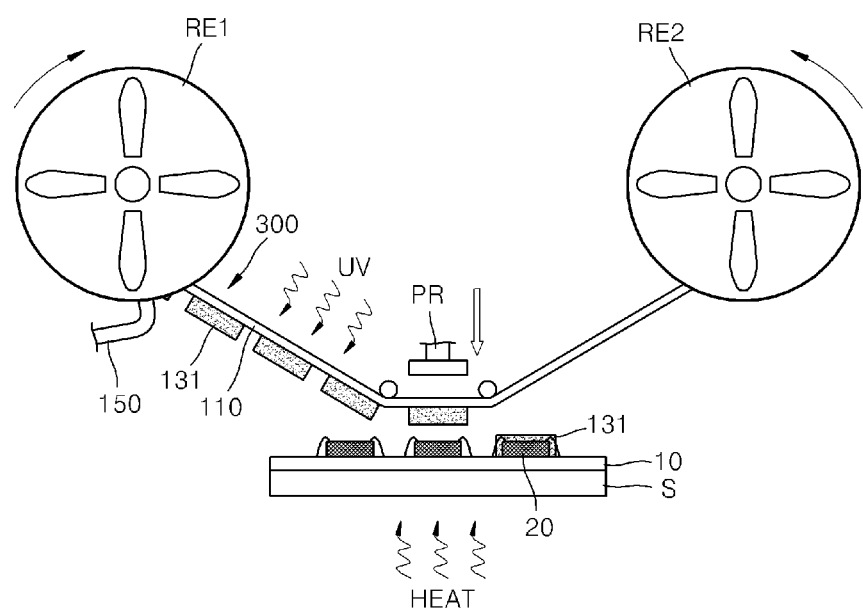
FIG. 12 is a view for explaining a method of coating a phosphor layer on a LED chip, according to another embodiment of the present invention.

FIG. 12 is a view for explaining a method of coating a phosphor layer on a LED chip, according to another embodiment of the present invention. The method according to the present embodiment is a direct press method using the phosphor film 300 of FIG. 7G. A supply reel RE1 supplies the phosphor film 300, and first, the cover film 150 is separated from the phosphor film 300. The phosphor film 300 supplied by the supply reel RE1 is disposed in such a way that the phosphor pieces 131 faces the LED chip 20. A substrate 10 to which a LED chip 20 is wire bonded is disposed on a heating stage S, and a pressure is applied to a surface of the base film 110 opposite to another surface on which the phosphor pieces 131 are disposed. When the phosphor pieces 131 approach the LED chip 20, due to the heat, the phosphor pieces 131 are changed to have a liquidity, so that the phosphor pieces 131 penetrate the wire. Thus, the phosphor pieces 131 are attached to the LED chip 20 and a surrounding thereof. Then, the base film 110 from which the phosphor pieces 131 are separated is retrieved by a retrieving reel RE2.

Figure 13A:
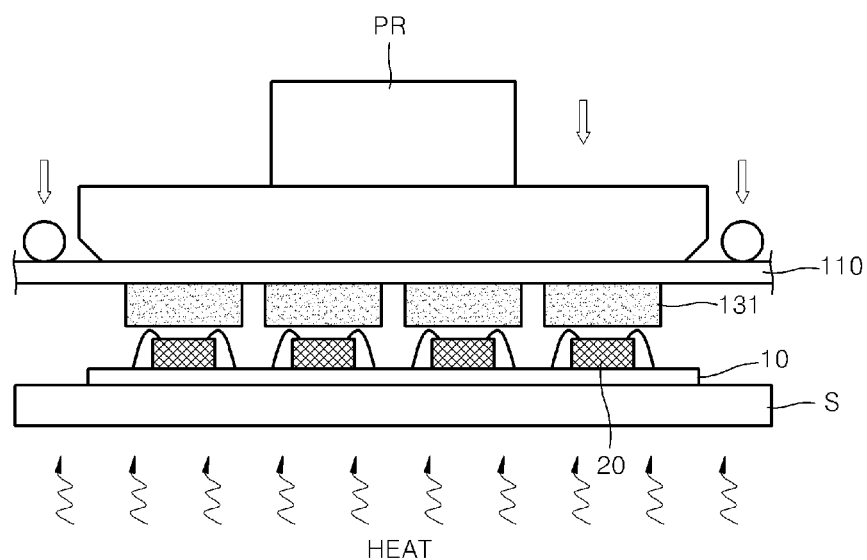
FIGS. 13A and 13B are views for explaining a method of coating a phosphor layer on LED chips, according to another embodiment of the present invention.
Figure 13B:
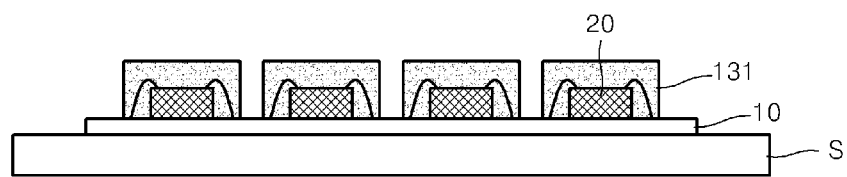

FIGS. 13A and 13B are views for explaining a method of coating a phosphor layer on LED chips, according to another embodiment of the present invention. The method according to the present embodiment is also a direct press method and is different from the method explained with reference to FIG. 12 in that a plurality of phosphor pieces 131 are simultaneously coated on a plurality of LED chips 20. The phosphor film 300 may be supplied and retrieved in the same way as explained with reference to FIG. 12. Alternatively, the phosphor film 500 of FIG. 9B, which is appropriately prepared corresponding to the alignment structure of the LED chips 20, may also be used herein after the cover film 150 is separated from the phosphor film 500.

Figure 14A:
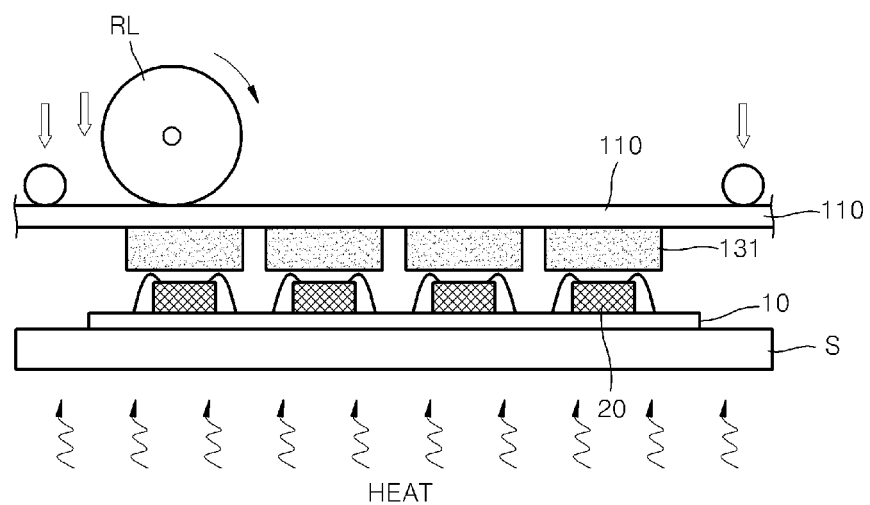
FIGS. 14A and 14B are views for explaining a method of coating a phosphor layer on LED chips, according to another embodiment of the present invention.
Figure 14B:
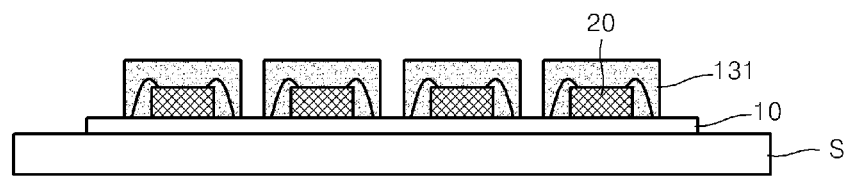

FIGS. 14A and 14B are views for explaining a method of coating a phosphor layer on LED chips, according to another embodiment of the present invention. The method according to the present embodiment is a roll and press method in which pressing the surface of the base film 110 opposite to another surface on which the phosphor layer 300 is sequentially performed by a roller RL, thereby sequentially coating the LED chip 20.

Figure 15A:
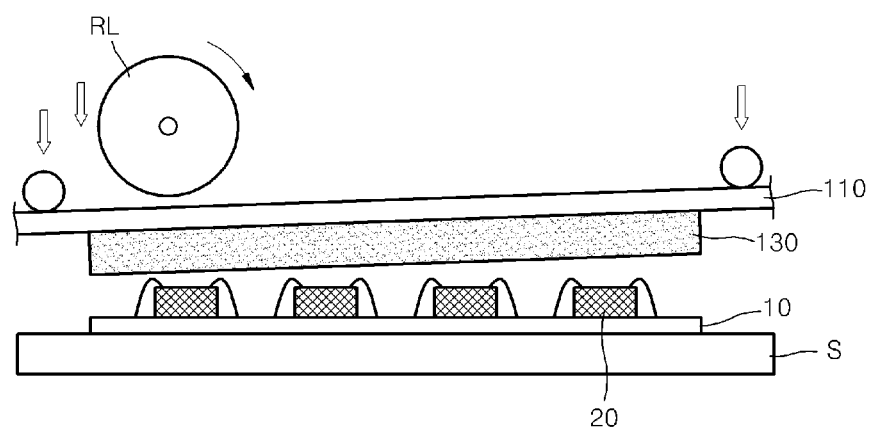
FIGS. 15A through 15C are views for explaining a method of coating a phosphor layer on LED chips, according to another embodiment of the present invention.
Figure 15B:
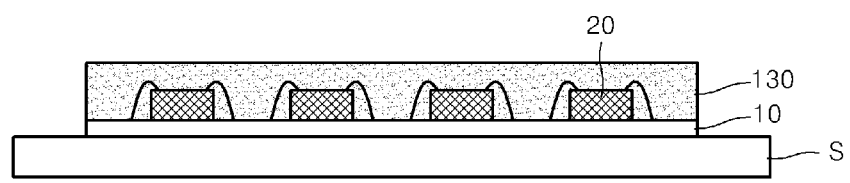
Figure 15C:
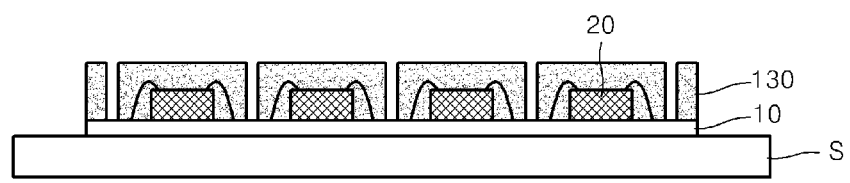

FIGS. 15A through 15C are views for explaining a method of coating a phosphor layer on LED chips, according to another embodiment of the present invention. The method according to the present embodiment is a roll and press method, and the phosphor layer 130 does not consist of phosphor pieces. For example, the phosphor film 300 of FIG. 4 may be used after the cover film 150 is separated from the phosphor film 300. The phosphor layer 130 may be coated on the LED chips 20 at once, and then cut in units of separate LED chips. In the present embodiment, a direct press method may also be used to coat the LED chips 20 with the phosphor layer 130 at once.

In the above embodiments for coating a phosphor layer, a substrate to which a LED chip is wire-bonded is exemplarily used. However, the present invention is not limited thereto. For example, any one of various LED-chip structures including a pre-mold type, a printed circuit board (PCB) applied array type, and a flip-chip structure may also be used.

The phosphor film is in an incompletely cured phase at room temperature and when heated, a modulus of the phosphor film is lowered. Thus, the phosphor film is suitable for coating a light-emitting chip with a uniform thickness. In addition, when the phosphor film is coated on a wire-bonded light-emitting chip, a wire is not deformed.

As described above, in the methods of forming a phosphor film and the methods of coating a phosphor layer on a light-emitting chip according to the one or more of the above embodiments of the present invention, a phosphor film is formed to have a structure enabling a phosphor layer to be easily coated on a light-emitting chip, and when the phosphor film is coated on various kinds of light-emitting chips, the coating thickness may be uniform. Thus, light-emitting devices manufactured using the phosphor film may have high light quality.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. A phosphor film, comprising:
    a base film having a top surface and a bottom surface;
    a phosphor layer disposed on the top surface of the base film, the phosphor layer including a B-stage cured resin material and phosphor particles mixed with the B-stage cured resin material; and
    a cover film disposed on and attached to the phosphor layer for protecting the phosphor layer, wherein:
    the phosphor layer and the cover film attached thereto are detachable from the base film by a pressing force applied upward onto the bottom surface of the base film, and
    when the phosphor layer is detached from the base film, the resin material of the phosphor layer is a material that is B-stage cured, such that the phosphor layer is further detachable from the cover film by heat.

2. The phosphor film of claim 1, wherein the phosphor layer is in a B-stage cured phase at room temperature and when heated, the phase of the phosphor layer is changed to have a liquidity.

3. The phosphor film of claim 2, wherein a modulus of the phosphor layer at a temperature of about 0 to about 25 is 100 MPa or more and 500 MPa or less, and a modulus of the phosphor layer at a temperature of about 60 to about 80 is in a range of about 0.5 MPa to about 3 MPa.

4. The phosphor film of claim 1, wherein the base film comprises an expandable polymer material.

5. The phosphor film of claim 4, wherein the base film comprises polyolefin.

6. The phosphor film of claim 1, further comprising a temporary adhesive layer interposed between the phosphor layer and the cover film.

7. The phosphor film of claim 1, wherein the phosphor layer is divided into a plurality of phosphor layer pieces spaced apart from each other at given intervals.

8. The phosphor film of claim 7, wherein the cover film is divided into a plurality of cover film pieces with sizes corresponding to the phosphor layer pieces.

9. A method of forming a phosphor film, the method comprising:
   preparing a base film having a top surface and a bottom surface; and
   forming a phosphor layer on the top surface of the base film such that the phosphor layer comprises a B-stage cured resin material and phosphor particles mixed with the B-stage cured resin material, and
   forming a cover film attached to the phosphor layer, wherein:
   the phosphor layer is divided into a plurality of phosphor layer pieces spaced apart from each other,
   the phosphor layer and the cover film attached thereto are detachable from the base film by a pressing force applied upward onto the bottom surface of the base film, and
   when the phosphor layer is detached from the base film, the resin material of the phosphor layer is a material that is B-stage cured, such that the phosphor layer is further detachable from the cover film by heat.

10. The method of claim 9, wherein the forming of the phosphor layer comprises:
    forming a thin layer on the base film, wherein the thin layer comprises the incompletely cured resin material and the phosphor particles mixed with the incompletely cured resin material;
    forming a cover film on the thin layer;
    forming cutting lines along which the thin layer and the cover film are to be cut into pieces with given sizes; and
    expanding the base film so that the thin layer and the cover film are spaced apart from each other along the cutting lines.

11. The method of claim 10, wherein the forming of the cutting lines comprises:
    forming a plurality of first cutting lines parallel to each other in one direction in the thin layer and the cover film; and
    cutting the thin layer, the cover film, and the base film in a strip form along a second cutting line perpendicular to the first cutting lines.

12. The method of claim 11, further comprising packaging the phosphor film cut in the strip form in a reel form.

13. The method of claim 9, wherein the forming of the phosphor layer comprises:
    forming a thin layer on the base film, wherein the thin layer comprises the incompletely cured resin material and the phosphor particles mixed with the incompletely cured resin material;
    a plurality of first cutting lines parallel to each other in one direction in the thin layer;
    expanding the base film so that the thin layer is divided into a plurality of regions by the first cutting lines;
    forming a cover film on the thin layer; and
    cutting the cover film, the thin layer, and the base film in a strip form along a second cutting line perpendicular to the first cutting lines.

14. The method of claim 9, wherein:
    the forming of the phosphor layer comprises:
    positioning a mask having a plurality of holes with sizes corresponding to the phosphor layer pieces on the base film;
    printing a mixture comprising the B-stage cured resin material and the phosphor particles on the base film by using the mask, and
    the forming of the cover film comprises:
    forming the cover film on the printed mixture.

15. The method of claim 14, further comprising cutting the base film in a strip form.

16. A method of coating a phosphor layer on a plurality of light-emitting diode (LED) chips, the method comprising:
    preparing a phosphor film such that the phosphor film comprises:
    a phosphor layer that comprises a B-stage cured resin material and phosphor particles mixed with the B-stage cured resin material, and
    a base film on a top surface of which the phosphor layer is formed and a cover film attached to the phosphor layer for protecting the phosphor layer,
    detaching the phosphor layer and the cover film attached thereto from the base film by applying a pressing force upward onto the bottom surface of the base film, and
    coating the detached phosphor layer on the LED chips and on the surroundings of the LED chips by heating the detached phosphor layer so as to have a liquidity and pressing the phosphor layer having the liquidity toward the LED chip, wherein
    when the phosphor layer is detached from the base film, the resin material of the phosphor layer is a material that is B-stage cured.

17. The method of claim 16, wherein the phosphor layer is cut into a plurality of phosphor layer pieces with sizes corresponding to the LED chips.

18. The method of claim 17, wherein the cover film is cut together with the phosphor layer into a plurality of cover film pieces with sizes corresponding to the LED chips.

19. The method of claim 17, wherein the coating of the phosphor layer comprises:
    separating the cover film from the phosphor film;
    positioning the phosphor film from which the cover film is removed in such a way that one phosphor piece faces one of the LED chips; and
    applying a pressure to a surface of the base film opposite to another surface on which the phosphor pieces are formed, so as to separate the phosphor piece from the base film, and heating the phosphor piece to have a liquidity so that the phosphor piece having a liquidity is attached to the LED chip and a surrounding of the LED chip.

20. The method of claim 19, further comprising irradiating ultraviolet rays to reduce an adhesive force of between the phosphor piece and the base film.

21. The method of claim 19, wherein the phosphor pieces are sequentially coated on the LED chips and surroundings of the LED chips by pressing the surface of the base film opposite to the surface on which the phosphor pieces are formed by using a roller, so that one phosphor piece is coated on one LED chip and a surrounding thereof.

22. The method of claim 19, wherein the phosphor pieces are simultaneously coated on the LED chips and surroundings of the LED chips by pressing the surface of the base film opposite to the surface on which the phosphor pieces are formed.

23. The method of claim 16, wherein the LED chips are wire-bonded to a substrate.

24. A method of coating a phosphor layer on a plurality of light-emitting diode (LED) chips, the method comprising:

preparing a phosphor film comprising a phosphor layer that comprises a B-stage cured resin material and phosphor particles mixed with the B-stage cured resin material; and coating the phosphor layer on the LED chips and surroundings of the LED chips by heating the phosphor layer so as to have a liquidity and pressing the phosphor layer having a liquidity toward the LED chip, wherein:

the phosphor film further comprises: a base film on which the phosphor layer is formed and a cover film for protecting the phosphor layer, the phosphor layer is cut into a plurality of phosphor pieces with sizes corresponding to the LED chips, the cover film is cut together with the phosphor layer into a plurality of cover film pieces with sizes corresponding to the LED chips, the coating of the phosphor layer comprises:
- picking up one phosphor piece and one cover film piece from the base film;
- positioning the phosphor piece and the cover film in such a way that the phosphor piece faces one of the LED chips; and
- heating the phosphor piece to have a liquidity and pressing the phosphor piece having the liquidity toward the one of the LED chips, and when the phosphor layer is detached from the base film, the resin material of the phosphor layer is a material that is B-stage cured.

25. The method of claim 24, further comprising irradiating ultraviolet rays to reduce an adhesive force between the phosphor piece and the base film.

\* \* \* \* \*